(12) United States Patent
Ohnishi et al.

(10) Patent No.: US 9,633,820 B2
(45) Date of Patent: Apr. 25, 2017

(54) METHOD FOR FORMING RESIST FILM AND CHARGED PARTICLE BEAM WRITING METHOD

(71) Applicant: NuFlare Technology, Inc., Yokohama (JP)

(72) Inventors: Takayuki Ohnishi, Kanagawa (JP); Hirohito Anze, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 4 days.

(21) Appl. No.: 14/886,434

(22) Filed: Oct. 19, 2015

(65) Prior Publication Data
US 2016/0111253 A1   Apr. 21, 2016

(30) Foreign Application Priority Data

Oct. 20, 2014   (JP) .................................. 2014-213511

(51) Int. Cl.
| | |
|---|---|
| G03F 7/16 | (2006.01) |
| H01J 37/317 | (2006.01) |
| G03F 7/00 | (2006.01) |
| G03F 7/038 | (2006.01) |
| G03F 7/039 | (2006.01) |
| G03F 7/09 | (2006.01) |
| G03F 7/11 | (2006.01) |

(52) U.S. Cl.
CPC ........ *H01J 37/3174* (2013.01); *G03F 7/0035* (2013.01); *G03F 7/0382* (2013.01); *G03F 7/0392* (2013.01); *G03F 7/091* (2013.01); *G03F 7/11* (2013.01); *H01J 2237/31754* (2013.01)

(58) Field of Classification Search
USPC ........ 430/310–313, 316–318, 322, 324, 325, 430/329, 644; 250/492.3
See application file for complete search history.

(56) References Cited

U.S. PATENT DOCUMENTS 4,456,678 A * 6/1984 Lee ........................ G03F 7/0045
430/270.1
4,548,893 A * 10/1985 Lee ........................ G03F 7/0045
430/270.1

(Continued)

FOREIGN PATENT DOCUMENTS

| JP | 11-312634 | 11/1999 |
| JP | 2011-171497 | 9/2011 |

*Primary Examiner* — Bernard Souw
(74) *Attorney, Agent, or Firm* — Oblon, McClelland, Maier & Neustadt, L.L.P.

(57) ABSTRACT

In a method for forming a resist film, a first resist film is formed on a light shielding film formed on a substrate, by using a spin coating method. A protective film is formed on the first resist film. The protective film and the first resist film are simultaneously removed at the same region to expose a portion of the light shielding film. A first region in which the second resist film is formed on the light shielding film and a second region in which the second resist film is formed on the first resist film through the protective film, are provided. The protective film and the second resist film are simultaneously removed in the second region to expose the first resist film. A region in which the first resist film, and a region in which the second resist film, is formed, are separately provided on the substrate.

13 Claims, 15 Drawing Sheets

(56) References Cited

U.S. PATENT DOCUMENTS

| | | | | |
|---|---|---|---|---|
| 4,748,132 A * | 5/1988 | Fukuzawa | ............... | B82Y 10/00 |
| | | | | 148/DIG. 137 |
| 5,290,664 A * | 3/1994 | Matsumoto | ............. | G03F 7/095 |
| | | | | 250/492.3 |
| 5,424,173 A * | 6/1995 | Wakabayashi | ......... | B82Y 10/00 |
| | | | | 250/492.3 |
| 7,011,927 B2 * | 3/2006 | Iwamatsu | ............... | B82Y 10/00 |
| | | | | 250/492.2 |

* cited by examiner

METHOD FOR FORMING RESIST FILM AND CHARGED PARTICLE BEAM WRITING METHOD

CROSS-REFERENCE TO THE RELATED APPLICATION

The entire disclosure of the Japanese Patent Application No. 2014-213511, filed on Oct. 20, 2014 including specification, claims, drawings, and summary, on which the Convention priority of the present application is based, are incorporated herein in its entirety.

FIELD OF THE INVENTION

The present invention relates to a method for forming a resist film and a charged particle beam writing method.

BACKGROUND

Recently, with an increasing integration degree of a semiconductor device, the dimensions of individual elements have become finer, and the widths of wiring and gates constituting each element have also become finer.

An electron beam lithography technique that supports such reduction in the dimensions of elements includes a step of applying a resist composition on a surface of a substrate through a light shielding film, a step of transferring a predetermined pattern by irradiating an electron beam to form a latent image of the pattern in the resist, a step of heating the substrate as necessary, a step of developing the resist to form a desired fine pattern on the substrate, and a step of processing such as etching the light shielding film using the fine pattern as a mask.

The electron beam lithography technique inherently provides a superior resolution, since it uses an electron beam, which is a charged particle beam. For this reason, the electron beam lithography technique has been used in the production of a mask for state-of-the-art semiconductor devices typified by DRAM (Dynamic Random Access Memory).

Japanese Laid-Open Patent Publication No. 1999-312634 discloses a method for producing a semiconductor integrated circuit apparatus using an electron beam lithography technique.

As disclosed in Japanese Laid-Open Patent Publication No. 2011-171497, the aforementioned resist plays an important role in the electron beam lithography technology. For example, a chemical amplification resist has been generally used in the recent electron beam lithography technology. When an unnecessary portion is removed from a resist film formed on a substrate using a reaction caused by an electron beam, a patterned resist film is formed on the substrate. By using the patterned resist film, processing is performed on the substrate.

As mentioned above, the resist plays an important role in the electron beam lithography technology. In recent years, in order to cope with reduction in dimensions of elements, considerations are being made regarding enhancement of resolution of a resist, improvement of roughness of line edges of a resist pattern, control of sensitivity of a resist, or the like. In particular, investigation into controlling a sensitivity of a resist so as to improve accuracy of critical dimension (CD) of a pattern has been conducted.

For example, in order to enhance throughput in a conventional electron beam lithography technology, a high-sensitivity resist of which the sensitivity is equal to or less than 10 $\mu C./cm^2$ has been used. However, with the enhancement of CD accuracy required in a pattern, the sensitivity of a resist is lowered to 20 $\mu C./cm^2$ to 30 $\mu C./cm^2$. In addition, since writing throughput is largely enhanced by adopting multi-beam technology which uses a plurality of electron beams for writing, it makes it possible to further lower the sensitivity of the resist. Specifically, it is possible to perform writing without lowering the throughput even in a state in which the sensitivity is equal to or less than 50 $\mu C./cm^2$. By lowering the sensitivity of the resist, a variation in CD due to the blur of the beam can be reduced, and as a result, CD accuracy can be improved.

However, lowering of the sensitivity of the resist causes a time for a writing step to be lengthened, and therefore, the throughput of electron beam writing is reduced.

In this case, as a pattern to be written on one substrate, there is a pattern in which high writing accuracy of nanometer (nm) order is required in order to correspond to a reduction of the dimensions of the elements. Also, the pattern to be written generally includes a pattern of which required writing accuracy is not so high, in addition to the above pattern. As one example, the required writing accuracy of a barcode pattern or an ID chip pattern made of a number, a symbol or the like, having a wide writing area, is not so high. For example, writing accuracy of a micrometer order ($\mu m$) is required.

Therefore, there is a need for technology of improving CD accuracy by using a resist of which the sensitivity is controlled to be low in a pattern requiring high accuracy and enhancing throughput of writing by using a high-sensitivity resist in a pattern not requiring high accuracy, with respect to one substrate in which a pattern is transferred. The technology can be achieved by arranging a low-sensitivity resist film in a region in which a pattern requiring high accuracy is formed and a high-sensitivity resist film in a region in which a pattern not requiring high accuracy is formed on one substrate.

In the case of performing writing of a pattern requiring high accuracy using the electron beam lithography technology, high flatness is required for a surface of a resist film to be used. Specifically, it is required that a difference between the thickest portion and the thinnest portion of the resist film is within a range of 1 $\mu m$ to 2 $\mu m$, preferably equal to or less than 0.5 $\mu m$. In addition, a task in the future is to reduce the difference to be equal to or less than 0.1 $\mu m$.

In order to achieve the above-mentioned flatness of the surface of a resist film, it is necessary to adopt a spin coating method suitable for formation of a film having high flatness of the surface.

However, as is well known in the art, in the case where a resist is applied to a substrate in which a pattern is transferred using the spin coating method, it is usual that only one type of resist film is formed on the entire surface of one side of the substrate. Therefore, it is hard to arrange a resist film with an optimal sensitivity in each of a plurality of regions into which the substrate is virtually divided, by the spin coating method.

On the other hand, as a method for forming resist films having different sensitivities respectively in the plurality of regions resulting from virtual division, a method using an inkjet method can be considered.

However, according to a method for coating a resist by the inkjet method, a large height difference is caused between dots formed by supply of a resist. Therefore, it is hard to form a resist film having the flatness of the surface suitable for formation of a pattern requiring high accuracy. That is, a difference between the thickest portion and the thinnest portion in a resist film formed by the inkjet coating method is hardly within the aforementioned range and it is hard to perform writing of a pattern requiring high accuracy.

As described above, there is a need for technology of arranging one type of resist film having an optimal sensitivity and a high flatness of the surface in each of a plurality of regions into which one substrate in which a pattern is transferred is divided according to the accuracy required of a pattern to be written. In such technology, it is necessary to use a spin coating method suitable for formation of a resist film having high flatness of the surface. The present invention has been made in view of these points. That is, an object of the present invention is to provide a method for forming a resist film for forming one optimal type of resist film respectively in a plurality of regions of which the number is two or more, on one substrate by the spin coating method.

Also, an object of the present invention is to provide a method for forming a resist film for forming one optimal type of resist film respectively in a plurality of regions of which the number is two or more, on one substrate by the spin coating method and performing writing with high efficiency using a charged particle beam.

Other challenges and advantages of the present invention are apparent from the following description.

SUMMARY OF THE INVENTION

According to one aspect of the present invention, a method for forming a resist film includes forming a first resist film on a light shielding film formed on a substrate, by using a spin coating method. A protective film is formed on the first resist film. Simultaneous removal of a region of the protective film and a region of the first resist film corresponding to the region of the protective film is performed to expose a portion of the light shielding film. A second resist film is formed on the protective film and an exposed portion of the light shielding film on the substrate using a spin coating method, to provide a first region in which the second resist film is formed on the light shielding film and a second region in which the second resist film is formed on the protective film. A region is separately formed, in which the first resist film is provided on the light shielding film and in which the second resist film is provided on the light shielding film, by simultaneously removing the protective film and the second resist film in the second region.

According to another aspect of the present invention, a method for forming a resist film includes forming a first resist film on a light shielding film formed on a substrate, by using a spin coating method. A first protective film is formed on the first resist film. A region of the first protective film and a region of the first resist film corresponding to the region of the first protective film is simultaneously removed, and a portion of the light shielding film is exposed. A second resist film is formed on the first protective film and an exposed portion of the light shielding film on the substrate using a spin coating method to provide a first region in which the second resist film is formed on the light shielding film, and a second region in which the second resist film is formed on the protective film. A region in which the first resist film is formed, and a region in which the second resist film is formed on the light shielding film, are separately formed by simultaneously removing the first protective film and the second resist film in the second region. A second protective film is formed on the first resist film in the second region and on the second resist film in the first region after removing the first protective film. A portion of the second protective film and a portion of at least one of the first resist film and the second resist film under the second protective film are simultaneously removed to provide a removing region in which the light shielding film is exposed. A third resist film is formed on the second protective film and in the removing region using the spin coating method to provide a third region in which the third resist film is formed in the removing region, and a fourth region in which the third resist film is formed on the second protective film that is formed on the first resist film, and the second resist film. A region in which the first resist film is provided, a region in which the second resist film is provided, and a region in which the third resist film is provided, are separately formed on the light shielding film, by simultaneously removing the second protective film and the third resist film in the fourth region.

According to another aspect of the present invention, a charged particle beam writing method includes forming a first resist film on a light shielding film formed on a substrate, by using a spin coating method. A protective film is formed on the first resist film. A region of the protective film and a region of the first resist film corresponding to the region of the protective film is simultaneously removed to expose a portion of the light shielding film. A second resist film is formed on the protective film and an exposed portion of the light shielding film on the substrate using a spin coating method to provide a first region in which the second resist film is formed on the light shielding film and a second region in which the second resist film is formed on the protective film. A region is separately formed in which the first resist film is provided on the light-shielding film and a region in which the second resist film is provided, by simultaneously removing the protective film and the second resist in the second region. A pattern is written on each of the first resist film and the second resist film using a charged particle beam.

DETAILED DESCRIPTION OF THE EMBODIMENT

It is preferable to use a spin coating method, as a method for forming a resist film having high flatness on a substrate in which a pattern is transferred, using a resist. However, in the case of the spin coating method, it is usual to coat only one type of resist on the entire surface of one side of a substrate. Therefore, according to a conventional method for forming a resist film using the spin coating method, as described above, it is difficult to select and dispose one optimal type of resist film in each of a plurality of regions obtained by virtual division on one substrate. Therefore, it is difficult to form various different types of resist films on the substrate.

On the other hand, embodiments of the present invention relate to a method for forming a resist film for forming one desired type of resist film in each of a plurality of regions, of which the number is two or more, on one substrate by using the spin coating method. In addition, the embodiments of the present invention make it possible to form a plurality of different types of resist films on the one substrate using the spin coating method.

The present embodiment will be described using the drawings below.

First Embodiment

According to a method for forming a resist film of a first embodiment of the present invention, it is possible to form one optimal type of resist film respectively in a plurality of regions of which the number is two or more, on one substrate, by using the spin coating method. That is, the method for forming a resist film of the first embodiment is a method for forming a plurality of types of resist films on one substrate by forming an optimal resist film respectively in a plurality of regions on the one substrate using the spin coating method.

Figure 1:
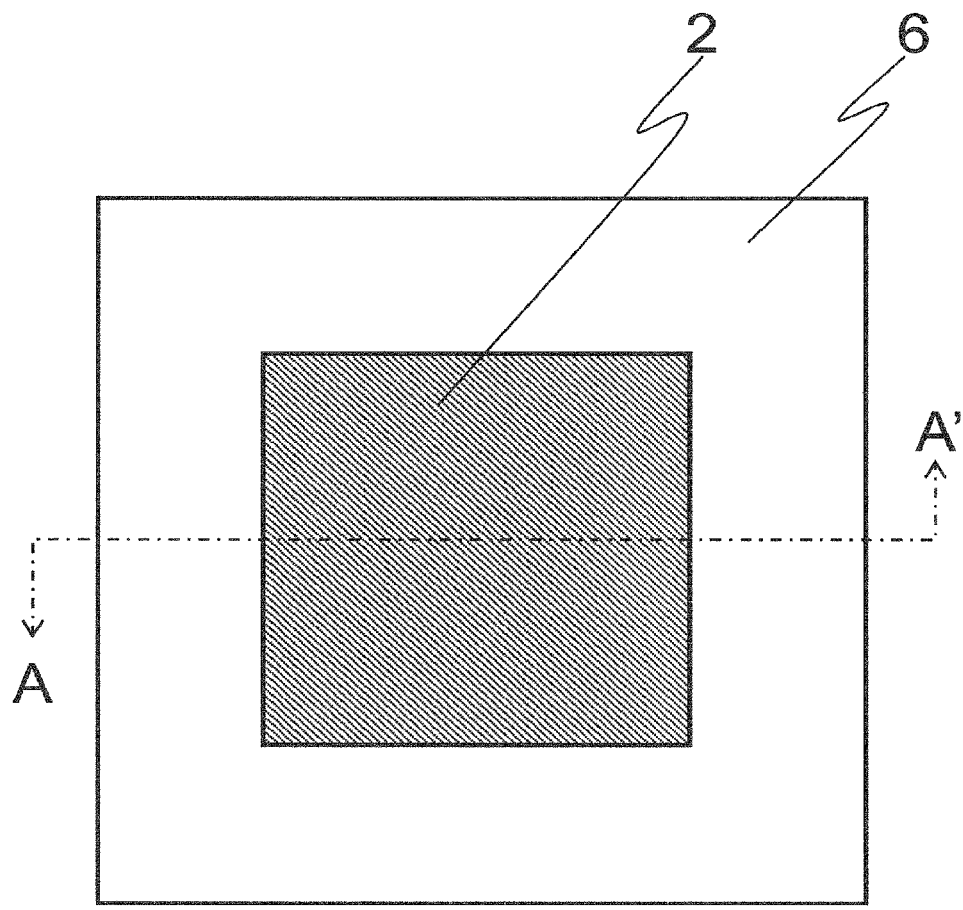
FIG. 1 is a plan view schematically illustrating an example of a substrate formed by the method for forming a resist film according to the first embodiment of the present invention.

FIG. 1 is a plan view schematically illustrating an example of a substrate formed by the method for forming a resist film according to the first embodiment of the present invention. FIG. 3 to FIG. 7 are cross-sectional views of the substrate schematically illustrating the method for forming a resist film according to the first embodiment of the present invention.

A first resist film 2 having a rectangular shape is disposed in a region including a center of a substrate 1. In peripheral edge regions of the substrate 1, there is disposed a second resist film 6 having a rectangular shape of which a central region is opened so as to surround a periphery of the first resist film 2 adjacent to the first resist film 2. The first resist film 2 having a rectangular shape is disposed in the opened central region of the second resist film 6, so that the second resist film 6 has a rectangular shape framing the first resist film 2.

The method for forming a resist film according to the first embodiment of the present invention will be described using a flowchart below.

Figure 2:
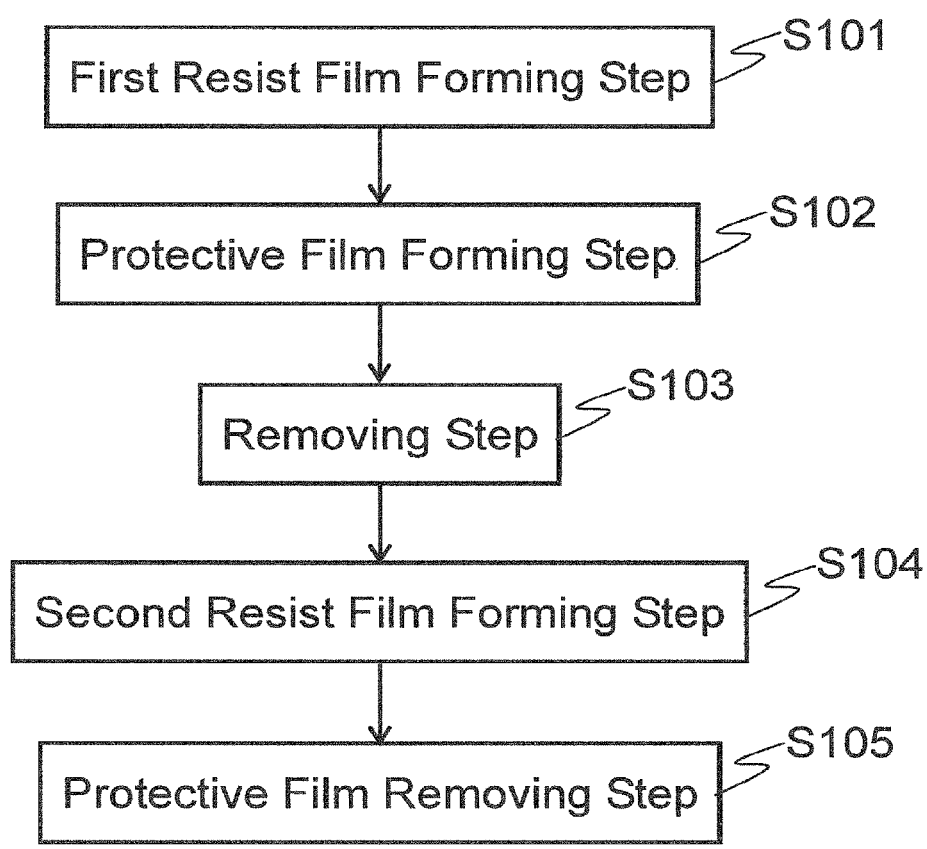
FIG. 2 is a flowchart illustrating the method for forming a resist film according to the first embodiment of the present invention.

FIG. 2 is a flowchart illustrating the method for forming a resist film according to the first embodiment of the present invention.

As illustrated in FIG. 2, the method for forming a resist film of the first embodiment of the present invention includes a first resist film forming step (S101) of forming a first resist film on a substrate using a spin coating method, a protective film forming step (S102) of forming a protective film on the first resist film, a removing step (S103) of removing the same regions of the protective film and the first resist film simultaneously to provide a removing region in which the substrate is exposed, a second resist film forming step (S104) of forming a second resist film on the substrate after the removing step (S103) using a spin coating method and providing a first region in which the second resist film is formed on the removing region and a second region in which the second resist film is formed on the first resist film through the protective film, and a protective film removing step (S105) of separately forming a region in which the first resist film is provided on the substrate and a region in which the second resist film is provided, by simultaneously removing the protective film on the second region and the second resist film on the protective film to expose the first resist film disposed under the protective film.

Next, the first resist film forming step (S101) to the protective film removing step (S105) of the method for forming a resist film according to the first embodiment of the present invention will be described with reference to the appropriate drawings.

Also, a cross-sectional view of the substrate is used to explain the steps in the following description. In this case, respective drawings illustrate cross-sections of the substrate in each of the steps, which correspond to a cross-section taken along A-A' line of the substrate 1 in FIG. 1 as described above. In the drawings, components which are common to the drawings are denoted by the same reference numerals and a redundant description will be omitted.

Figure 3:
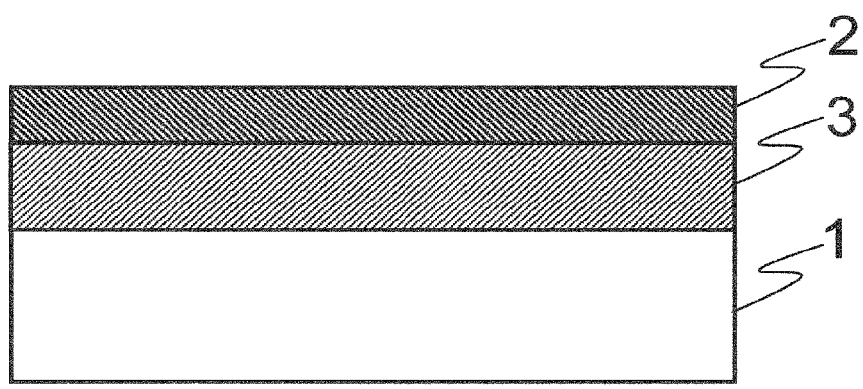
FIG. 3 is a cross-sectional view of the substrate schematically illustrating the first resist film forming step of the method for forming a resist film according to the first embodiment of the present invention.

FIG. 3 is a cross-sectional view of the substrate schematically illustrating the first resist film forming step of the method for forming a resist film according to the first embodiment of the present invention.

In the first resist film forming step (S101) of the method for forming a resist film of the first embodiment of the present invention, as illustrated in FIG. 3, a first resist film 2 is formed on the substrate 1 using a spin coating method. The spin coating method is a coating method by rotating a flat substrate at high speed to form a flat and thin coating film on the substrate by centrifugal force. It is preferable that, if required, the first resist film 2 is subjected to a pre-bake in order to remove volatile components, such as solvent, and is maintained on the substrate 1, after formation by the spin coating method. The pre-bake is a step different from a post exposure bake (referred to as a "PEB") for pattern formation and is made by performing heating, for example, for about 7 minutes to 20 minutes at a temperature of 70° C. to 200° C.

A glass substrate can be used as the substrate 1. A light shielding film 3 is formed on the surface of the glass substrate. In the case of exposing a mask manufactured using the substrate 1 by an exposure device, such as a stepper, and imprinting an LSI pattern onto a wafer or the like, the light shielding film 3 is provided in order to shield light unnecessary for formation of the LSI pattern. An example of the light shielding film 3 can include a film made of chromium oxide (CrOx) and chromium (Cr). In this case, in the first resist film forming step (S101), as illustrated in FIG. 3, the spin coating method is used, and the first resist film 2 is formed on the light shielding film 3 on the substrate 1.

The first resist film 2 can be a positive type chemically amplified resist film formed by using a positive type chemical amplification resist which is described below. In addition, the first resist film 2 can be a resist having sensitivity different from a positive type chemical amplification resist used to form a second resist film in the second resist film forming step (S104) which is described below, for example, a resist having sensitivity lower than the positive type chemical amplification resist.

The chemical amplification resist is a resist including an acid generator which generates an acid by irradiation of light and an electron beam and a compound which reacts by the acid, and is used to form a resist pattern by changing alkali solubility characteristics of the compound by using reaction by acid catalyst.

The chemical amplification resist includes a positive type and a negative type, and the negative type chemical amplification resist contains an alkali-soluble resin, a crosslinking agent, an acid generator, and the like. The negative type chemical amplification resist is in an alkali-soluble state as it is. Then, the negative type chemical amplification resist becomes an alkali-insoluble state by crosslinking the cross-linking agent and the alkali-soluble resin by post exposure bake (PEB) using an acid generated from the acid generator by irradiation of exposure light, such as an electron beam, as a catalyst. Therefore, it is possible to form a desired negative type resist pattern by alkali development and irradiation of exposure light (referred to as patterning light-exposure) through a mask.

In addition, the positive type chemical amplification resist generally contains an alkali-insoluble polymer and an acid generator. The alkali-insoluble polymer has a structure in which, for example, a phenolic hydroxyl group of polyvinyl phenol is blocked by a protecting group. When exposure light, such as an electron beam, is irradiated onto the chemical amplification resist, the acid generator is decomposed to generate acid in a light exposure portion onto which the exposure light is irradiated. Thereafter, when a heating treatment is performed, since the protecting group which blocks the phenolic hydroxyl group is thermally decomposed by the catalytic action of acid, a phenolic hydroxyl group is generated through dissociation of the protecting group. Therefore, since the chemical amplification resist has alkali-soluble characteristics in the light exposure portion onto which exposure light is irradiated, a desired resist pattern is formed by dissolving and removing the light exposure portion in a development step using an alkali developer.

As an available positive type chemical amplification resist for formation of the first resist film 2, there are FEP171 (trademark name) and PRL009 (trademark name) manufactured by FUJIFILM Electronic Materials Co., Ltd., OEBR series (trademark name) manufactured by Tokyo Ohka Kogyo Co., Ltd., SEBP series (trademark name) manufactured by Shin-Etsu Chemical Co., Ltd., or the like.

Figure 4:
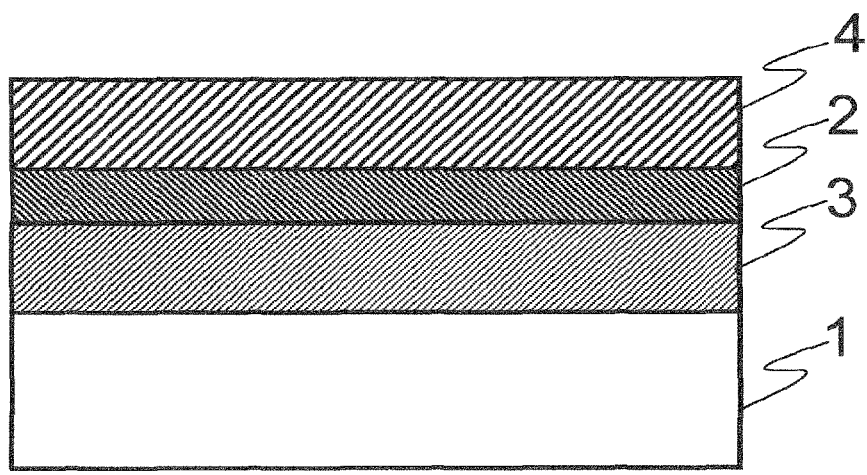
FIG. 4 is a cross-sectional view of the substrate schematically illustrating a protective film forming step of the method for forming a resist film according to the first embodiment of the present invention.

FIG. 4 is a cross-sectional view of the substrate schematically illustrating a protective film forming step of the method for forming a resist film according to the first embodiment of the present invention.

In the protective film forming step (S102) of the method for forming a resist film of the first embodiment of the present invention, as illustrated in FIG. 4 a protective film 4 is formed on the first resist film 2 on the substrate 1. The spin coating method can be used as a method for forming the protective film 4.

The protective film 4 is a film having solubility characteristics different from those of the second resist film formed in the second resist film forming step (S104) which is described below. That is, it is preferable that, when a certain solvent is selected, the protective film 4 and the second resist film as described below have greatly different solubility characteristics to each other with respect to the solvent. For example, when the second resist film is soluble in an organic solvent and is insoluble in an aqueous solvent, it is preferable that the protective film 4 is soluble in the aqueous solvent.

It is possible to use, for example, a film which is soluble in an aqueous dissolving liquid, which is known as an antistatic film in the electron beam lithography technology, as the protective film 4. In this case, the film used as the antistatic film in the electron beam lithography technology is a water-soluble film made of, for example, a conductive polymer (about 5%), water (about 95%), a small amount of surfactant, and the like. Also, as the protective film 4, conductivity is not necessarily required, and it is possible to select and use various materials as long as the film is soluble in, for example, an aqueous solvent.

Figure 5:
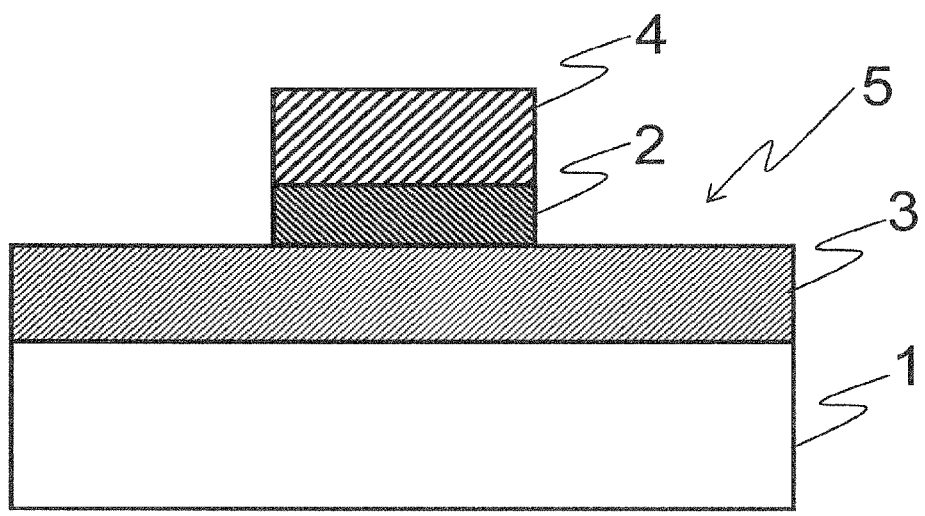
FIG. 5 is a cross-sectional view of the substrate schematically illustrating a removing step of the method for forming a resist film according to the first embodiment of the present invention.

FIG. 5 is a cross-sectional view of the substrate schematically illustrating a removing step of the method for forming a resist film according to the first embodiment of the present invention.

In the removing step (S103) of the method for forming a resist film of the first embodiment of the present invention, an unnecessary portion of the protective film 4 and an unnecessary portion of the first resist film 2 under the protective film 4, which are illustrated in FIG. 4 are removing by simultaneously removing the same regions of the protective film 4 and the first resist film 2. As illustrated in FIG. 5, a partial portion of the protective film 4 and a portion of the first resist film 2 under the partial portion of the protective film 4 remain on the substrate 1 and a removing region 5 through which the substrate 1 is exposed is formed. More specifically, a portion of the light shielding film 3 of the substrate 1 is exposed in the removing region 5.

In the removing step (S103), removing of the portion of the protective film 4 and the portion of the first resist film 2 under the protective film 4 can be performed by using a resist removing device (not illustrated).

As the aforementioned resist removing device, a device can be used which sprays removing liquid onto the protective film 4 and the first resist film 2 by using a nozzle and removes the unnecessary portions which are the portion of the protective film 4 and the portion of the first resist film 2 under the protective film 4.

The resist removing device can remove the unnecessary portions of the protective film 4 and the first resist film 2 with accuracy of a millimeter order. In this case, it is possible to use an organic solvent liquid, which is also referred to as a resist thinner or the like, as the removing liquid for removing the protective film 4 and the first resist film 2.

In addition, as another resist removing device, a removing device, which is referred to as an asher or the like, can be used which uses plasma ashing technology of converting oxygen gas or the like into plasma by a high frequency and removing a resist by using the plasma. In the case of using the removing device using the plasma ashing technology, it is possible to protect and leave necessary portions, such as the protective film 4 and the first resist film 2 in FIG. 5, from plasma and remove unnecessary exposed portions with accuracy of a millimeter order, by using, for example, a glass substrate or the like.

Figure 6:
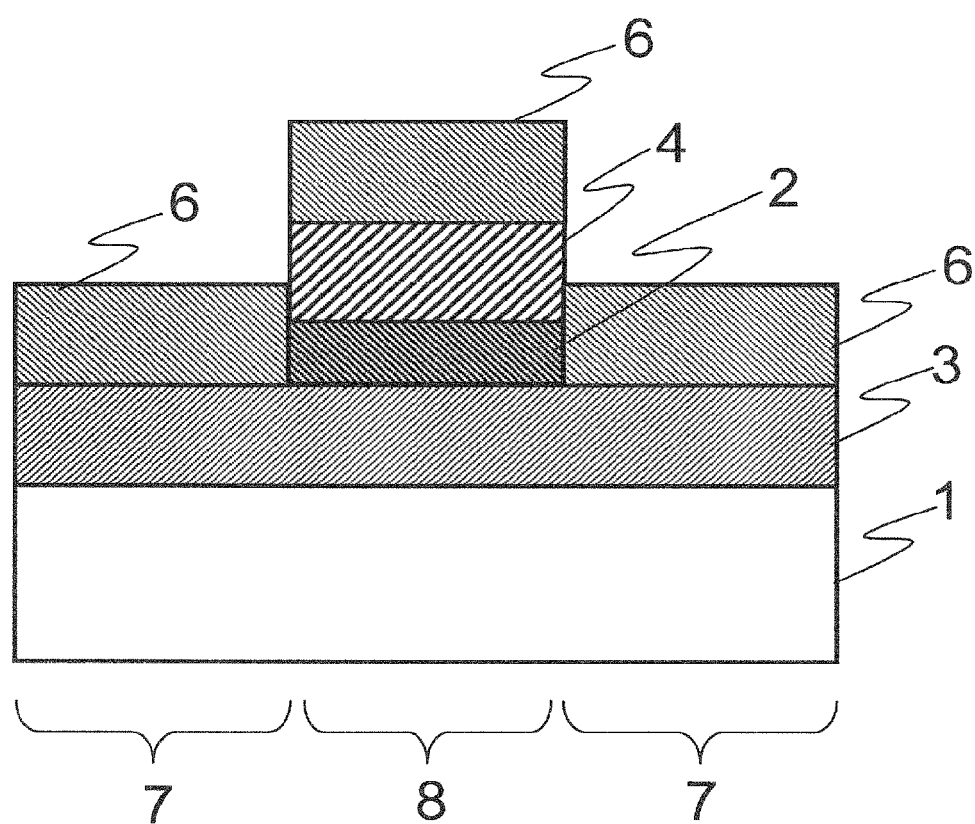
FIG. 6 is a cross-sectional view of the substrate schematically illustrating the second resist film forming step of the method for forming a resist film according to the first embodiment of the present invention.

FIG. 6 is a cross-sectional view of the substrate schematically illustrating the second resist film forming step of the method for forming a resist film according to the first embodiment of the present invention.

In the second resist film forming step (S104) of the method for forming a resist film according to the first embodiment of the present invention, as illustrated in FIG. 6, a second resist film 6 is formed on the substrate 1 using a spin coating method after the removing step (S103). That is, the second resist film 6 is formed on a portion of the protective film 4 and an exposed portion of the light shielding film 3 in the substrate 1 by using the spin coating method. Then, a first region 7 in which the second resist film 6 is formed and a second region 8 in which the second resist film 6 is formed on the first resist film 2 through the protective film 4 are provided on the light shielding film 3 in the substrate 1. It is preferable that, if required, the second resist film 6 is subjected to a pre-bake in order to remove volatile components, such as solvent, and is maintained on the substrate 1, after formation by the spin coating method. The pre-bake is performed by heating, for example, for about 7 minutes to 20 minutes at a temperature of 70° C. to 200° C.

The second resist film 6 can be a positive type chemically amplified resist film formed by using a positive type chemical amplification resist. In addition, the second resist film 6 can be a resist having sensitivity different from a positive type chemical amplification resist used to form the first resist film 2 in the first resist film forming step (S101) which is described above, for example, a resist having sensitivity higher than the positive type chemical amplification resist used in the formation of the first resist film 2.

As an available positive type chemical amplification resist for formation of the second resist film 6, there are the positive type amplification resists which can be used for the formation of the above-mentioned first resist film 2, for example, FEP171 (trademark name) and PRL009 (trademark name) manufactured by FUJIFILM Electronic Materials Co., Ltd., OEBR series (trademark name) manufactured by Tokyo Ohka Kogyo Co., Ltd., SEBP series (trademark name) manufactured by Shin-Etsu Chemical Co., Ltd., or the like. Further, a resist having sensitivity different from a positive type chemical amplification resist used to form the first resist film 2, for example, a resist having sensitivity higher than the positive type chemical amplification resist can be used in the formation of the first resist film 2, as the positive type chemical amplification resist used in the formation of the second resist film 6.

As illustrated in FIG. 6, in the second region 8 on the light shielding film 3 of the substrate 1, the protective film 4 is formed on a portion of the first resist film 2 formed by the first resist film forming step (S101) by the protective film forming step (S102), and the second resist film 6 is formed on a portion of the protective film 4 by the second resist film forming step (S104). On the other hand, in the first region 7, the second resist film 6 is formed on the light shielding film 3 of the substrate 1 by the second resist film forming step (S104) and the protective film 4 is not provided. In this case, it is preferable that a relationship (A+B)>(C) is satisfied between a thickness A of the portion of the first resist film 2 formed by the first resist film forming step (S101), a thickness B of the protective film 4 formed by the protective film forming step (S102), and a thickness C of the second resist film 6 formed by the second resist film forming step (S104).

By satisfying the aforementioned relationship, in the second region 8 illustrated in FIG. 6, a portion of a side surface of the protective film 4 can be exposed at a boundary with the first region 7. As a result, it makes it easy to simultaneously remove the protective film 4 and the second resist film 6 by using a solvent in the protective film removing step (S105) which is described below.

Figure 7:
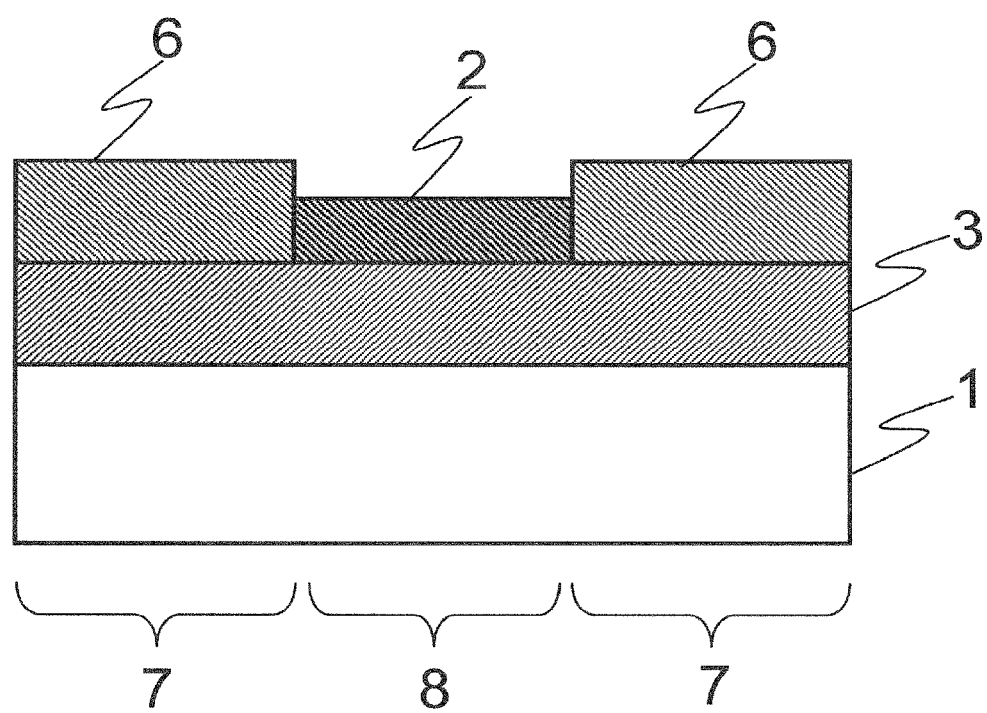
FIG. 7 is a cross-sectional view of the substrate schematically illustrating a protective film removing step of the method for forming a resist film according to the first embodiment of the present invention.

FIG. 7 is a cross-sectional view of the substrate schematically illustrating a protective film removing step of the method for forming a resist film according to the first embodiment of the present invention.

In the protective film removing step (S105) of the method for forming a resist film of the first embodiment of the present invention, the portion of the protective film 4 in the second region 8 illustrated in FIG. 6 is simultaneously removed with the second resist film 6. That is, the portion of the protective film 4 and the second resist film are simultaneously removed in the second region. As illustrated in FIG. 7, by exposing the first resist film 2, the first region 7 in which the second resist film 6 is provided on the substrate 1 and the second region 8 in which the first resist film 2 is provided are separately formed. That is, a region in which the first resist film is provided on the light shielding film and a region in which the second resist film is provided on the light shielding film are separately formed, by simultaneously removing the protective film and the second resist in the second region.

In the protective film removing step (S105), removing a portion of the protective film 4 and the second resist film 6 on the portion of the protective film 4 can be performed by washing the protective film 4 with a solvent that dissolves the protective film 4 using the substrate 1 on which the protective film 4 and the second resist film 6 are formed. In this case, it is required that the solvent does not dissolve the first resist film 2 and the second resist film 6. Therefore, an aqueous solvent, such as pure water, can be used, for example, when the protective film 4 is dissolved in the aqueous solvent and the first resist film 2 and the second resist film 6 are not dissolved in the aqueous solvent.

As described above, the method for forming a resist film of the first embodiment of the present invention can provide an optimal resist film of two types of resist films to each of a plurality of regions on one substrate by using the spin coating method according to the first resist film forming step (S101) to the protective film removing step (S105). As a result, it is possible to provide formation regions of two types of resist films that are different from each other, on one substrate. That is, it is possible to provide formation regions of two types of resist films that are different from each other, on the light shielding film on the substrate.

Therefore, the method for forming a resist film of the first embodiment of the present invention can arrange a low-sensitivity resist film in a region in which a pattern requiring high accuracy is formed and arrange a high-sensitivity resist film in a region in which a pattern not requiring high accuracy is formed, in one substrate in which a pattern is transferred by an electron beam, for example. That is, it is possible to virtually divide an arrangement surface of a resist film into a plurality of regions according to required accuracy of a pattern to be written and arrange, for example, a resist film with optimal sensitivity in each of the plurality of regions, with respect to one substrate in which a pattern is transferred.

As a result, the substrate including two different types of resist films, which are obtained by the method for forming a resist film of the first embodiment of the present invention, is applied to electron beam lithography technology, achieving enhancement in writing throughput.

In this case, the method for forming a resist film of the first embodiment of the present invention makes it possible to form two types of resist films on one substrate using the spin coating method. However, the first embodiment of the present invention is not limited to a configuration in which types of formed resist films are two types. According to the method for forming a resist film of the first embodiment of the present invention, it is possible to form more types of resist films on one substrate.

That is, another example of the method for forming a resist film of the first embodiment of the present invention can obtain a substrate in which one different type of resist film is further formed by performing the aforementioned first resist film forming step (S101) to the protective film removing step (S105) and thereafter, performing the same steps as the protective film forming step (S102) to the protective film removing step (S105) by using the obtained substrate in which two different types of resist films are formed.

Figure 8:
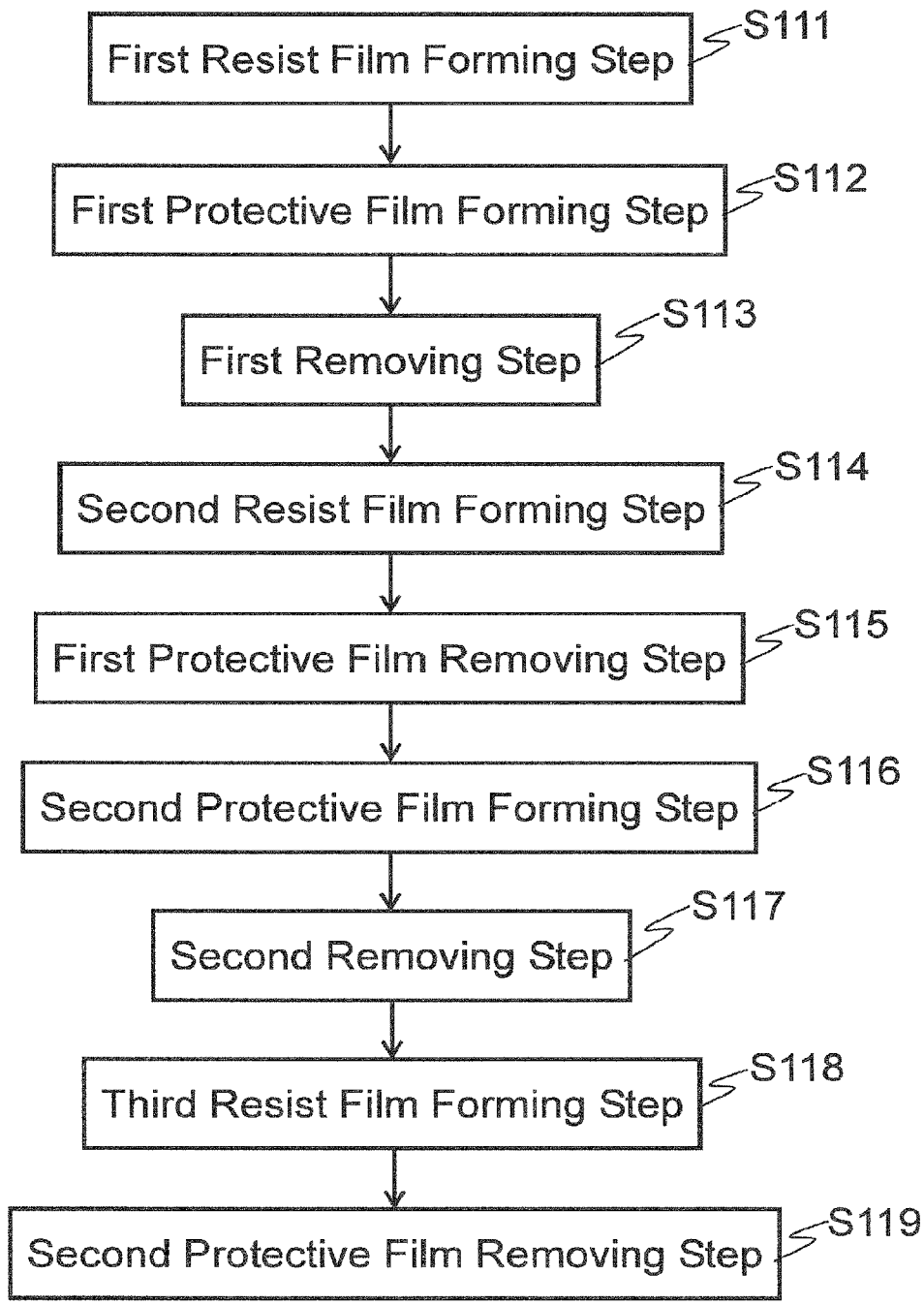
FIG. 8 is a flowchart illustrating another example of the method for forming a resist film according to the first embodiment of the present invention.

FIG. 8 is a flowchart illustrating another example of the method for forming a resist film according to the first embodiment of the present invention.

For example, as another example of the method for forming a resist film of the first embodiment of the present invention, a method for forming a resist film for forming first to third resist films whose types are different from one another on one substrate has a configuration as described below. In this case, as the third resist film which is newly provided, a positive type chemically amplified resist film can be used, which has sensitivity different from that of either of the first resist film and the second resist film, for example.

Another example of the method for forming a resist film of the first embodiment of the present invention includes a first resist film forming step (S111) of forming a first resist film on a substrate using a spin coating method, a first protective film forming step (S112) of forming a first protective film on the first resist film, a first removing step (S113) of removing the same regions of the first protective film and the first resist film simultaneously to provide a first removing region in which the substrate is exposed, a second resist film forming step (S114) of forming a second resist film on the substrate after the first removing step (S113) using a spin coating method and providing a first region in which the second resist film is formed on the first removing region and a second region in which the second resist film is formed on the first resist film through the first protective film, and a first protective film removing step (S115) of separately forming a region in which the first resist film is provided on the substrate and a region in which the second resist film is provided, by simultaneously removing the first protective film on the second region and the second resist film on the first protective film to expose the first resist film disposed under the first protective film.

In another example of the method for forming a resist film of the first embodiment of the present invention, a first resist film forming step (S111) is the same step as the first resist film forming step (S101) of the method for forming a resist film of the first embodiment of the present invention illustrated in FIG. 2. That is, the first resist film is formed on the light shielding film formed on the substrate, by using a spin coating method. The first protective film formation step (S112) is a similar step to the protective film forming step (S102) of the method for forming the resist film according to the first embodiment of the present invention illustrated in FIG. 2. That is, the first protective film in the first protective film formation step (S112) is a similar protective film to the protective film in the protective film forming step (S102). The first removing step (S113) is a similar step to the removing step (S103) of the method for forming the resist film according to the first embodiment of the present invention illustrated in FIG. 2. The second resist film forming step (S114) is a similar step to the second resist film forming step (S104) of the method for forming a resist film according to the first embodiment of the present invention illustrated in FIG. 2. The first protective film removing step (S115) is a similar step to the protective film removing step (S105) of the method for forming a resist film according to the first embodiment of the present invention illustrated in FIG. 2.

In another example of the method for forming a resist film according to the first embodiment of the present invention, a glass substrate as the substrate 1, on which a light shielding film is provided, can be used for the first resist film forming step (S111). In this case, in a first removing step (S113), a portion of the light shielding film of the substrate is exposed by removing of the first protective film and the first resist film. In a second resist film forming step (S114), the first region is a region in which the second resist film is formed on the light shielding film of the substrate.

In addition, another example of the method for forming a resist film of the first embodiment of the present invention includes a second protective film forming step (S116) of forming a second protective film on the substrate after the first protective film removing step (S115), a second removing step (S117) of simultaneously removing a portion of the second protective film and a portion of at least one of the first resist film and the second resist film under the protective film to provide a second removing region in which the substrate is exposed, a third resist film forming step (S118) of forming a third resist film on the substrate after the second removing step (S117) by using the spin coating method and providing a third region in which the third resist film is formed in the removing region and a fourth region in which the third resist film is formed on the first resist film and the second resist film through the second protective film, and a second protective film removing step (S119) of simultaneously removing the second protective film in the fourth region and the third resist film to expose the first resist film and the second resist film, and separately forming a region in which the first resist film is provided, a region in which the second resist film is provided, and a region in which the third resist film is provided, on the substrate. Further, in another example of the method for forming a resist film of the first embodiment of the present invention, the second protective film in the second protective film forming step (S116) is a similar protective film to the protective film in the protective film forming step (S102) of the method for forming the resist film according to the first embodiment of the present invention illustrated in FIG. 2. Furthermore, in the second protective film forming step (S116), the second protective film is formed on the first resist film in the second region and on the second resist film in the first region after removing the first protective film. Furthermore, in the third resist film forming step (S118), the third resist film is formed on the second protective film and in the second removing region.

In the first resist film forming step (S111), for example, a glass substrate as the substrate 1, on which a light shielding film is provided, can be used as the substrate. In this case, in the second removing step (S117), a portion of the light shielding film of the substrate is exposed by removing of the protective film, etc., as mentioned above. Then, in the third resist film forming step (S118), the third region is a region in which the third resist film is formed on the light shielding film of the substrate.

The another example of the method for forming a resist film of the first embodiment of the present invention which includes respective steps of the first resist film forming step (S111) to the second protective film removing step (S119) can provide an optimal resist film of three types of resist films to each of a plurality of regions on one substrate by using the spin coating method. As a result, it is possible to provide formation regions of three types of resist films which are different from one another, on one substrate. That is, it is possible to provide formation regions of three types of resist films which are different from one another, on the light shielding film on the substrate. Further, according to another example of the method for forming a resist film of the first embodiment, it is possible to form one optimal type of resist film respectively in three or more regions on one substrate by using the spin coating method. Furthermore, according to another example of the method for forming a resist film of the first embodiment, it is possible to form one optimal type of resist film respectively in three or more regions on the light shielding film on the substrate by using the spin coating method.

Second Embodiment

According to a method for forming a resist film of a second embodiment of the present invention, it is possible to form one optimal type of resist film respectively in a plurality of regions of which the number is two or more, on one substrate, by using the spin coating method. That is, the method for forming a resist film of the first embodiment is a method for forming a plurality of types of resist films on one substrate by forming an optimal resist film respectively in a plurality of regions on the one substrate using the spin coating method.

Furthermore, according to the method for forming a resist film of the first embodiment of the present invention, two types of positive type chemically amplified resist films having different sensitivities are formed on one substrate using two types of positive type chemical amplification resists having different sensitivities.

In this case, according to the present invention, the resist to be used is not limited to the positive type chemical amplification resists. For example, a negative type chemical amplification resist may be used.

Therefore, the method for forming a resist film of the second embodiment of the present invention forms two types of chemically amplified resist films having different sensitivities formed on one substrate by using two types of resists of a positive type chemical amplification resist and a negative type chemical amplification resist. That is, according to the method for forming a resist film of the second embodiment of the present invention, a second resist film formed similarly to the second resist film 6 of the aforementioned method for forming a resist film of the first embodiment of the present invention is formed by using the negative type chemical amplification resist.

Further, as illustrated in FIG. 2 to FIG. 5, the method for forming a resist film of the first embodiment of the present invention includes a first resist film forming step (S101) of forming a first resist film on a substrate using a spin coating method, a protective film forming step (S102) of forming a protective film on the first resist film, a removing step (S103) of removing the same regions of the protective film and the first resist film simultaneously to provide a removing region in which the substrate is exposed. The method for forming a resist film of the second embodiment of the present invention includes the same steps (S101 to S103). After these steps, the method for forming a resist film according to the second embodiment of the present invention includes the second resist film forming step (S204) and the protective film removing step (S205). The second resist film forming step (S204) corresponds to the second resist film forming step (S104) in the method for forming a resist film according to the first embodiment of the present invention. The protective film removing step (S205) corresponds to the protective film removing step (S105) in the method for forming a resist film according to the first embodiment of the present invention.

Therefore, when the method for forming a resist film of the second embodiment of the present invention is described below with reference to the drawings, a description of the same steps as the method for forming a resist film of the first embodiment of the present invention will be omitted to the extent possible for convenience and the second resist film forming step (S204) and the protective film removing step (S205) after the second resist film forming step (S204) will be described in detail. In the drawings used for description, components which are in common with the method for forming a resist film of the first embodiment of the present invention are denoted by the same reference numerals and a redundant description will be omitted.

Figure 9:
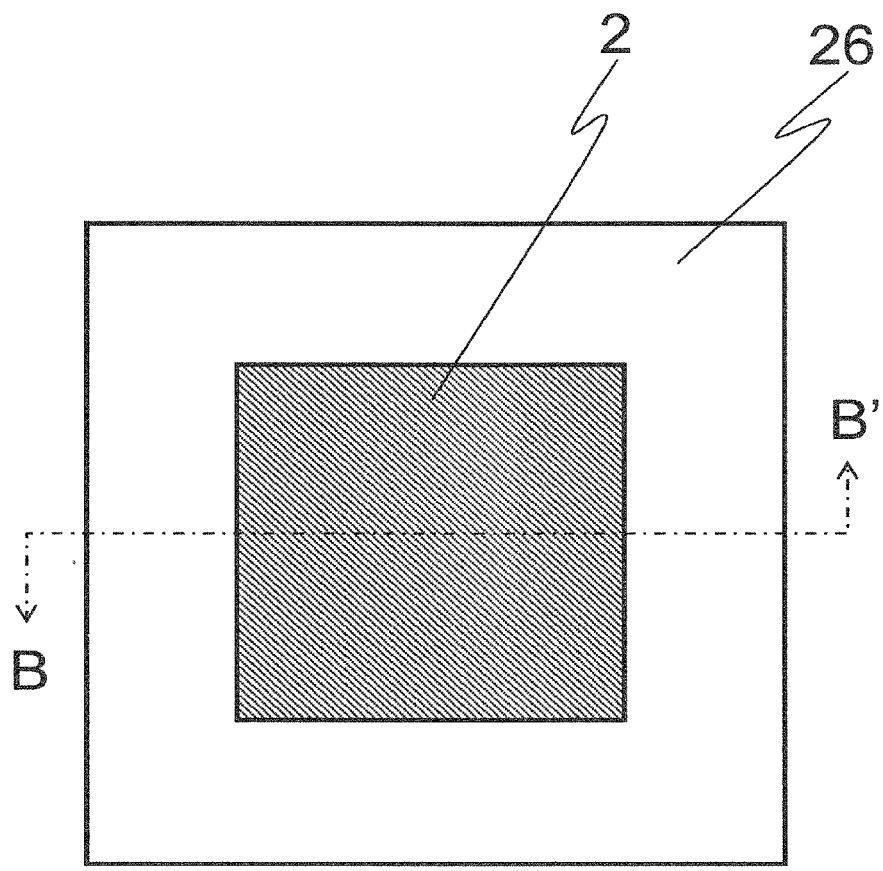
FIG. 9 is a plan view schematically illustrating an example of the substrate to be formed by the method for forming a resist film according to the second embodiment of the present invention.
Figure 11:
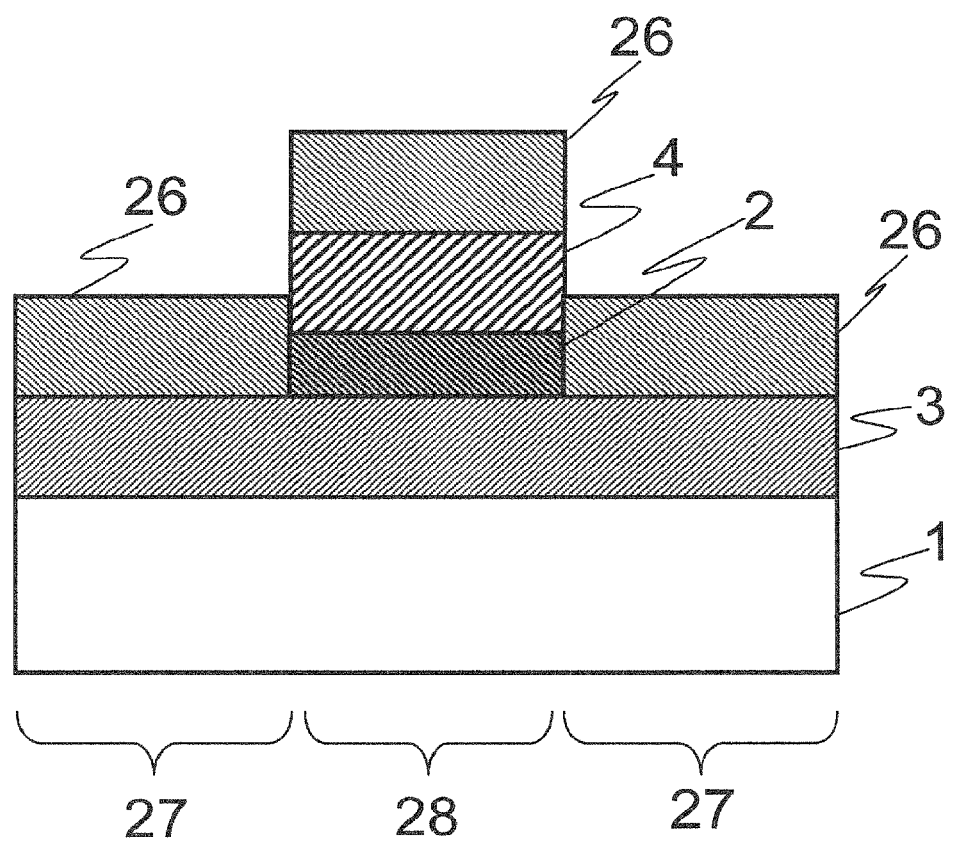
FIG. 11 is a cross-sectional view of the substrate schematically illustrating the second resist film forming step of the method for forming a resist film according to the second embodiment of the present invention.
Figure 12:
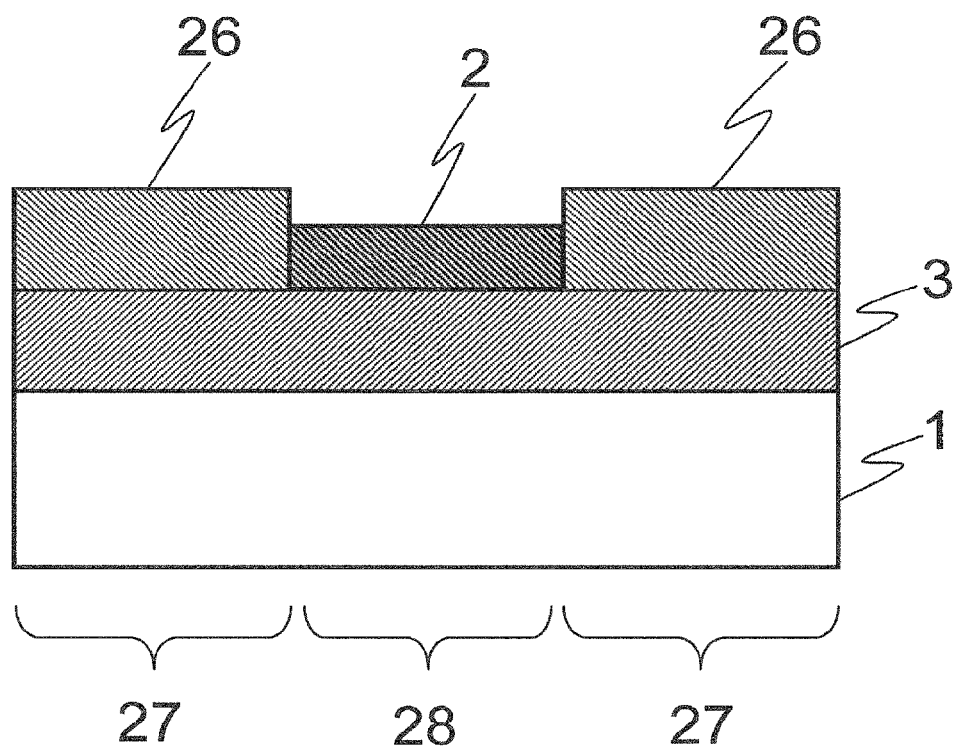
FIG. 12 is a cross-sectional view of the substrate schematically illustrating a protective film removing step of the method for forming a resist film according to the second embodiment of the present invention.

FIG. 9 is a plan view schematically illustrating an example of the substrate to be formed by the method for forming a resist film according to the second embodiment of the present invention. FIG. 11 and FIG. 12 are cross-sectional views of the substrate schematically illustrating the method for forming a resist film according to the second embodiment of the present invention.

As mentioned above, a glass substrate as the substrate 1, on which a light shielding film is provided, can be used as the substrate 1 (not illustrated in FIG. 9). As illustrated in FIG. 9, on the substrate 1 (not illustrated in FIG. 9), a first resist film 2 having a rectangular shape is disposed in a region including a center of the substrate 1. In peripheral edge regions of the substrate 1, there is disposed a second resist film 26 having a rectangular shape of which a central region is opened so as to surround a periphery of the first resist film 2 adjacent to the first resist film 2. The first resist film 2 having a rectangular shape is disposed in the opened central region of the second resist film 26, so that the second resist film 6 has a rectangular shape framing the first resist film 2.

Also, a cross-sectional view of the substrate is used to explain the steps in the following description. In this case, respective drawings illustrate cross-sections of the substrate in each of the steps, which correspond to a cross-section taken along B-B' line of the substrate 1 in FIG. 9 as described above. In the drawings, components which are common to the drawings are denoted by the same reference numerals and a redundant description will be omitted as much as possible.

Figure 10:
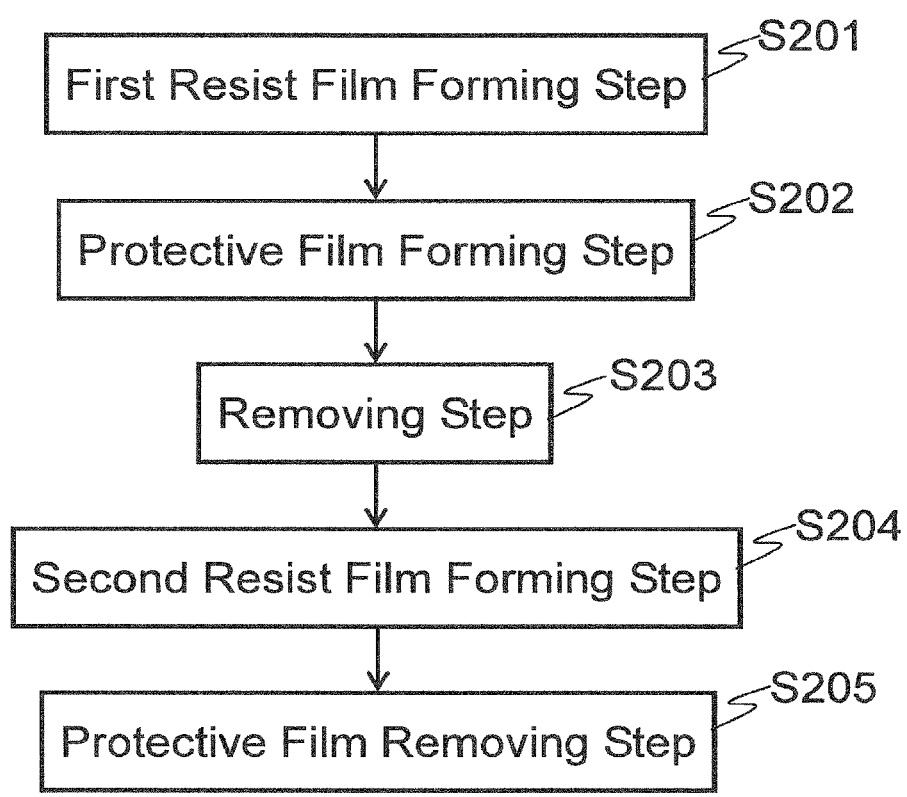
FIG. 10 is a flowchart illustrating the method for forming the resist film according to the second embodiment of the present invention.

FIG. 10 is a flowchart illustrating the method for forming the resist film according to the second embodiment of the present invention.

As mentioned above, as illustrated in FIG. 10, the method for forming a resist film of the second embodiment of the present invention includes a first resist film forming step (S201), a protective film forming step (S202), and a removing step (S203). These steps are similar to the first resist film forming step (S101), the protective film forming step (S102), and the removing step (S103) according to the first embodiment of the present invention of forming a first resist film on a substrate.

In the first resist film forming step (S201), as an available positive type chemical amplification resist for formation of the first resist film, there are FEP171 (trademark name) and PRL009 (trademark name) manufactured by FUJIFILM Electronic Materials Co., Ltd., OEBR series (trademark name) manufactured by Tokyo Ohka Kogyo Co., Ltd., SEBP series (trademark name) manufactured by Shin-Etsu Chemical Co., Ltd., or the like.

The method for forming the resist film according to the second embodiment of the present invention includes the second resist film forming step (S204) and the protective film removing step (S205) as mentioned above.

FIG. 11 is a cross-sectional view of the substrate schematically illustrating the second resist film forming step of the method for forming a resist film according to the second embodiment of the present invention.

In the second resist film forming step (S204) of the method for forming a resist film according to the second embodiment of the present invention, as illustrated in FIG. 11, the second resist film 26 is formed on the substrate 1 using a spin coating method after the removing step (S203), thereby the first region 27 in which the second resist film 26 is formed, and the second region 28 in which the second resist film 26 is formed on the first resist film 2 via the protective film 4 are formed. It is preferable that, if required, the second resist film 26 is subjected to a pre-bake in order to remove volatile components, such as solvent, and is maintained on the substrate 1, after formation by the spin coating method. The pre-bake is performed by heating, for example, for about 7 minutes to 20 minutes at a temperature of 70° C. to 200° C.

The second resist film 26, as mentioned above, can be a negative type chemically amplified resist film formed by using a negative type chemical amplification resist. In addition, the second resist film 26, as mentioned above, is preferably a resist having sensitivity different from a positive type chemical amplification resist used to form the first resist film 2 in the first resist film forming step (S201).

As an available positive type chemical amplification resist for formation of the second resist film 26, there are the negative type amplification resists which can be used for the formation of the above-mentioned first resist film 2, for example, NEB-22 (trademark name) and NEB-31 (trademark name) manufactured by Sumitomo Chemical Co., Ltd., and SEBN series (trademark name) manufactured by Shin-Etsu Chemical Co., Ltd., or the like.

As illustrated in FIG. 11, in the second region 28 on the substrate 1, the protective film 4 is formed on a portion of the first resist film 2 formed by the first resist film forming step (S201) by the protective film forming step (S202), and the second resist film 26 is formed on the portion of the protective film 4 by the second resist film forming step (S204). On the other hand, in the first region 27, the second resist film 26 is formed on the substrate 1 by the second resist film forming step (S204) and the protective film 4 is not provided. In this case, it is preferable that a relationship (A+B)>(C') is satisfied between a thickness A of a portion of the first resist film 2 formed by the first resist film forming step (S201), a thickness B of the protective film 4 formed by the protective film forming step (S202), and a thickness (C') of the second resist film 26 formed by the second resist film forming step (S204).

By satisfying the aforementioned relationship, in the second region 28 illustrated in FIG. 11, a portion of a side surface of the protective film 4 is exposed at a boundary with the first region 27. As a result, it makes it easy to simultaneously remove the protective film 4 and the second resist film 26 by using a solvent in the protective film removing step (S205) which is described below.

FIG. 12 is a cross-sectional view of the substrate schematically illustrating a protective film removing step of the method for forming a resist film according to the second embodiment of the present invention.

In the protective film removing step (S205) of the method for forming a resist film of the second embodiment of the present invention, a portion of the protective film 4 in the second region 28 illustrated in FIG. 11 is simultaneously removed with the second resist film 26. As illustrated in FIG. 12, by exposing the first resist film 2, the first region 27 in which the second resist film 26 is provided on the substrate 1 and the second region 28 in which the first resist film 2 is provided are separately formed.

In the protective film removing step (S205), removing the portion of the protective film 4 and the second resist film 26 on the protective film 4 can be performed by washing the protective film 4 with a solvent that dissolves the protective film 4 using the substrate 1 on which the protective film 4 and the second resist film 26 are formed. In this case, it is required that the solvent does not dissolve the first resist film 2 and the second resist film 26. Therefore, an aqueous solvent, such as pure water, can be used, for example, when the protective film 4 is dissolved in the aqueous solvent and the first resist film 2 and the second resist film 26 are not dissolved in the aqueous solvent.

As described above, the method for forming a resist film of the second embodiment of the present invention can provide resist films to each of two regions on one substrate, that is, one type of resist film on one region of the substrate, and a different type of resist film on another region of the same substrate, by using the spin coating method according to the first resist film forming step (S201) to the protective film removing step (S205).

Therefore, the method for forming a resist film of the second embodiment of the present invention can arrange a low-sensitivity resist film in a region in which a pattern requiring high accuracy is formed and arrange a high-sensitivity resist film in a region in which a pattern not requiring high accuracy is formed, in one substrate in which a pattern is transferred by electron beam, for example. That is, it is possible to virtually divide an arrangement surface of a resist film into a plurality of regions according to required accuracy of a pattern to be written and arrange, for example, a resist film with optimal sensitivity in each of the plurality of regions, with respect to one substrate in which a pattern is transferred.

As a result, the substrate including two different types of resist films, which are obtained by the method for forming a resist film of the second embodiment of the present invention, is applied to electron beam lithography technology, achieving enhancement in writing throughput.

In this case, the method for forming a resist film of the second embodiment of the present invention makes it possible to form two types of resist films, that is, positive type and negative type resist films on one substrate using the spin coating method. However, the second embodiment of the present invention is not limited to a configuration in which types of formed resist films are two types. According to the method for forming a resist film of the second embodiment of the present invention, the difference in sensitivities in resist films are considered as well as the positive type and negative type characteristics, thereby it is possible to form more types of resist films on one substrate.

That is, as well as the method for forming a resist film according to the first embodiment of the present invention as mentioned above, another example of the method for forming a resist film of the second embodiment of the present invention can obtain a substrate in which one different type of resist film is further formed by performing the aforementioned first resist film forming step (S201) to the protective film removing step (S205) and thereafter, performing the same steps as the protective film forming step (S202) to the protective film removing step (S205) by using the obtained substrate in which two different types of resist films are formed.

In this case, it is possible to use resist films having different sensitivities as the first resist film, the second resist film, and the third resist film. That is, it is possible to use, for example, positive type chemically amplified resist films having different sensitivities as the first resist film, the second resist film, and the third resist film.

In addition, one or two of the first resist film, the second resist film, and the third resist film can be a positive type chemically amplified resist film, and the remaining can be a negative type chemically amplified resist film. In a case where two of the first resist film, the second resist film, and the third resist film are a positive type chemically amplified resist film, it is preferable that the two resist films have different sensitivities to each other. Further, in a case where two of the first resist film, the second resist film, and the third resist film are a negative type chemically amplified resist film, it is preferable that the two resist films have different sensitivities to each other.

In the substrate obtained by the method for forming a resist film of the first embodiment of the present invention, as illustrated in FIGS. 9 and 12, two types, namely, a positive type resist film and a negative type resist film are formed adjacent to each other. Therefore, when the substrate is applied to electron beam lithography technology, light exposure performed on one resist film in the vicinity of a boundary between the two types of resist films may affect a fine pattern formed from the other resist film. That is, there is a possibility that generation of an undesired fine pattern or an undesired deformation of a fine pattern are caused in the vicinity of the boundary between the two resist films. For example, when a space pattern is to be formed in a boundary between two types, namely, a positive type resist film and a negative type resist film, there is a case in which electron beam exposure for forming the space pattern in the positive type resist film affects the negative type resist film in the vicinity of the boundary, and a space pattern having a desired shape cannot be formed in the negative type resist film in the vicinity of the boundary.

Therefore, in a case in which a pattern requiring high accuracy formed in a low-sensitivity resist film and a pattern not requiring high accuracy formed in a high-sensitivity resist film are disposed spaced apart from each other, it is preferable that the substrate obtained by the method for forming a resist film of the second embodiment of the present invention is used for formation of the patterns. Furthermore, it is preferable that a space between the pattern requiring high accuracy and the pattern not requiring accuracy, which are written on the substrate, is equal to or greater than 1 mm in consideration of accuracy of removing in the removing step (S203).

Figure 13:
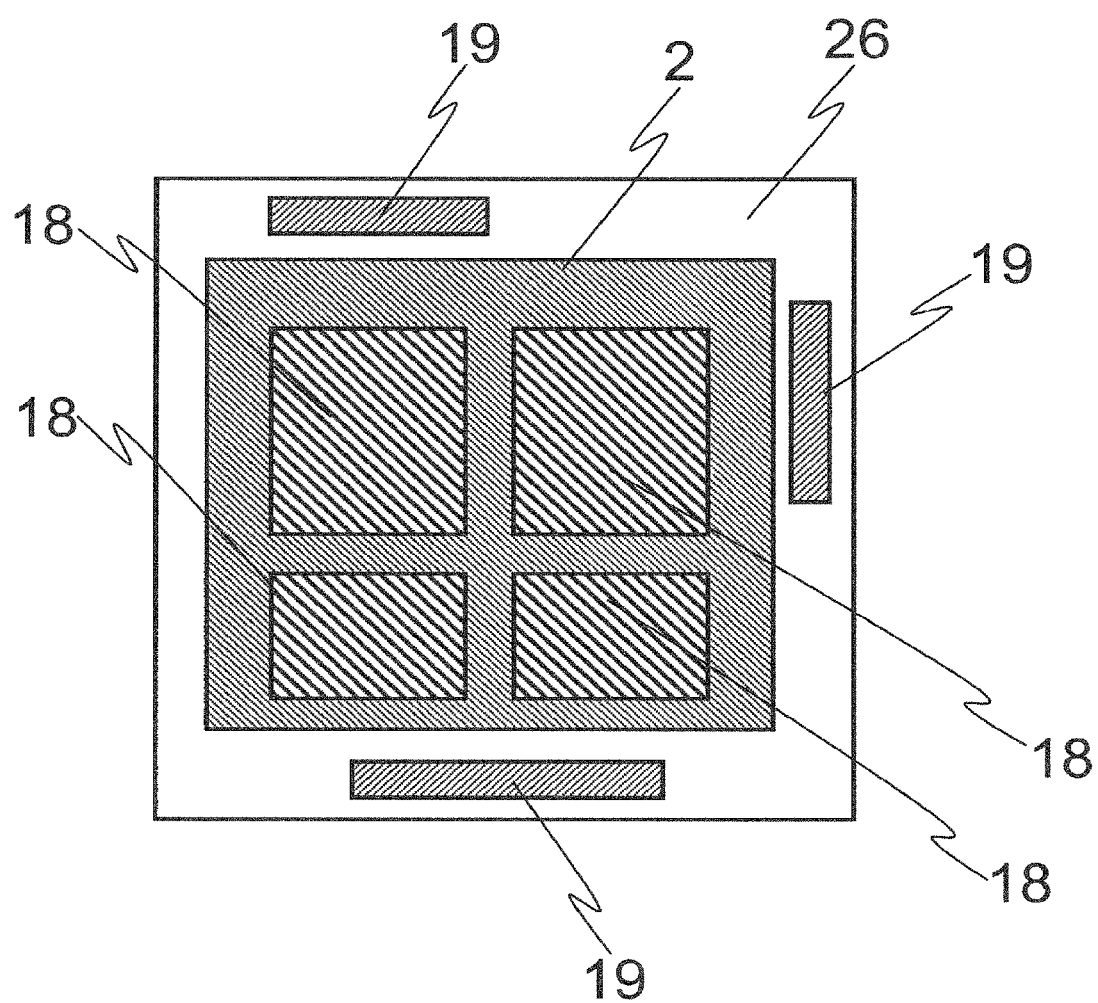
FIG. 13 is a plan view schematically illustrating an example of a preferable arrangement of a pattern to be transferred to a substrate obtained by the method for forming a resist film according to the second embodiment of the present invention.

FIG. 13 is a plan view schematically illustrating an example of a preferable arrangement of a pattern to be transferred to a substrate obtained by the method for forming a resist film according to the second embodiment of the present invention.

As illustrated in FIG. 13, for example, in the substrate 1 (not illustrated in FIG. 13), four patterns 18 requiring high accuracy are written in a region including a center of the substrate 1, and three patterns 19 not requiring high accuracy, for example, ID chips, are written in the vicinity of the substrate 1. The pattern 18 and the pattern 19 are formed spaced apart from each other.

The first resist film 2 having a rectangular shape is disposed in a region in which the patterns 18 are formed and which includes the center of the substrate 1 on the substrate 1. In formation regions of the patterns 19 in peripheral edge regions of the substrate 1, there is disposed a second resist film 26 having a rectangular shape of which a central region is opened so as to surround a periphery of the first resist film 2 adjacent to the first resist film 2. The first resist film 2 having a rectangular shape is disposed in the opened central region of the second resist film 26, so that the second resist film 26 has a rectangular shape framing the first resist film 2.

The first resist film 2 and the second resist film 26 are disposed adjacent to each other on the substrate 1. Since the pattern 18 and the pattern 19 are formed spaced apart from each other, light exposure, which is performed on one of the first resist film 2 and the second resist film 26 in the vicinity of a boundary between the first resist film 2 and the second resist film 26, does not affect a fine pattern formed by the other of the first resist film 2 and the second resist film 26, although the substrate 1 is applied to the electron beam lithography technology. That is, it is possible to reduce the possibility that generation of an undesired pattern or an undesired deformation of a pattern are caused in the vicinity of the boundary between the first resist film 2 and the second resist film 26.

Third Embodiment

A writing method of a third embodiment of the present invention uses a substrate, obtained by the method for forming a resist film of the present invention, in which a pattern is transferred. That is, the substrate in which a pattern is transferred in the writing method of the third embodiment of the present invention is a substrate obtained by a method for forming a plurality of types of resist films on one substrate by forming an optimal resist film in each of a plurality of regions on the one substrate using the spin coating method. Furthermore, the writing method of the third embodiment of the present invention includes performing light exposure for a desired pattern on a resist film on the substrate in which a pattern is transferred. As a result, the writing method of the third embodiment can form one optimal type of resist film in each of a plurality of regions of which the number is two or more by using the spin coating method, and perform writing with high efficiency using the resist films.

It is preferable that the light exposure step of the writing method of the third embodiment of the present invention is a light exposure step using an electron beam as exposure light.

The writing method of the third embodiment of the present invention can use, a substrate in which a pattern is transferred, obtained by the method for forming a resist film of the first embodiment of the present invention. That is, it is possible to use, for example, the substrate illustrated in FIG. 1 in which a pattern is transferred.

Therefore, the writing method of the third embodiment of the present invention can include the same steps (S301 to S305) as the first resist film forming step (S101) to the protective film removing step (S105) in the method for forming a resist film of the first embodiment of the present invention described with reference to FIGS. 3 to 7.

Figure 14:
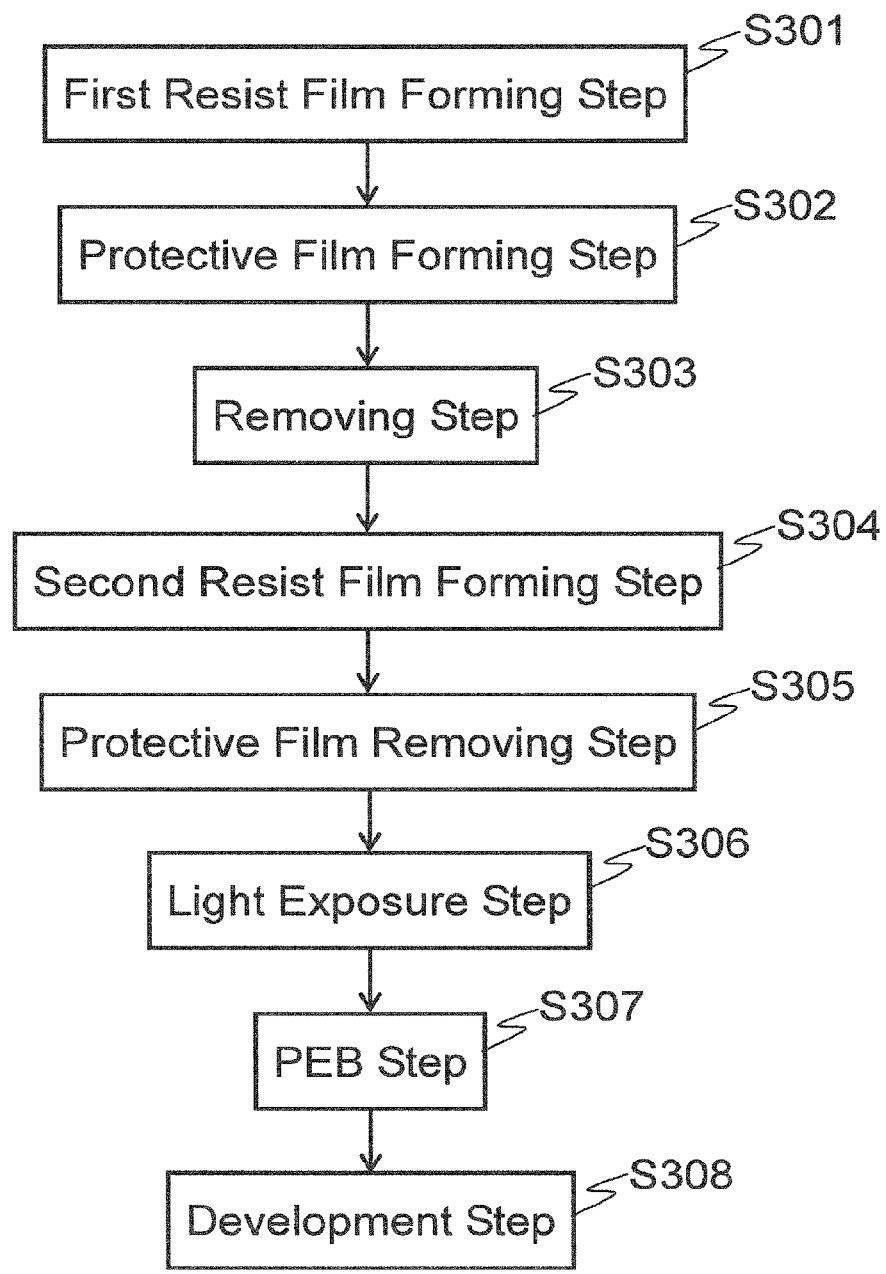
FIG. 14 is a flowchart illustrating the electron beam writing method according to the third embodiment of the present invention.

FIG. 14 is a flowchart illustrating the electron beam writing method according to the third embodiment of the present invention.

The electron beam writing method of the third embodiment of the present invention includes a first resist film forming step (S301) of forming a first resist film on a substrate using a spin coating method, a protective film forming step (S302) of forming a protective film on the first resist film, a removing step (S303) of removing the same regions of the protective film and the first resist film simultaneously to provide a removing region in which the substrate is exposed, a second resist film forming step (S304) of forming a second resist film on the substrate after the removing step (S303) using a spin coating method and providing a first region in which the second resist film is formed on the removing region and a second region in which the second resist film is formed on the first resist film through the protective film, and a protective film removing step (S305) of separately forming a region in which the first resist film is provided on the substrate and a region in which the second resist film is provided, by simultaneously removing the protective film on the second region and the second resist film on the protective film to expose the first resist film disposed under the protective film.

Each step (S301 to S305) of the writing method according to the third embodiment of the present invention, as described above, can include the same steps as the first resist film forming step (S101) to the protective film removing step (S105) in the method for forming a resist film of the first embodiment of the present invention.

Furthermore, the writing method of the third embodiment of the present invention includes the light exposure step (S306) that performs exposure for a desired pattern on each of the first resist film on the second resist film after the protective film removing step (S305).

In addition, the writing method of the third embodiment of the present invention can include a PEB step (S307) of performing a PEB step for promoting a reaction within a resist in a heating step after light exposure, after the light exposure step (S306). Furthermore, the writing method of the third embodiment of the present invention includes a development step (S308) after the light exposure step (S306), or after the PEB step (S307) after the light exposure step (S306).

The respective steps of the writing method of the third embodiment of the present invention will be described below with reference to appropriate drawings. In this case, since steps of a first resist film forming step (S301) to a protective film removing step (S305) are identical to the corresponding steps (S101 to S105) in the method for forming a resist film of the first embodiment of the present invention, a description thereof will be omitted for convenience. In particular, the light exposure step (S306), the PEB step (S307), and the development step (S308) will be described. Also, a cross-sectional view of the substrate is used to explain the steps in the following description. In this case, respective drawings illustrate cross-sections of the substrate in each of the steps, which correspond to a cross-section taken along A-A' line of the substrate 1 in FIG. 1 as described above. In the drawings, components which are common to the method for forming the resist film according to the first embodiment of the present invention are denoted by the same reference numerals and therefore a redundant description will be omitted.

Furthermore, the writing method of the third embodiment of the present invention includes, as mentioned above, the light exposure step (S306) that performs exposure for a desired pattern on each of the first resist film on the second resist film after the protective film removing step (S305).

Figure 15:
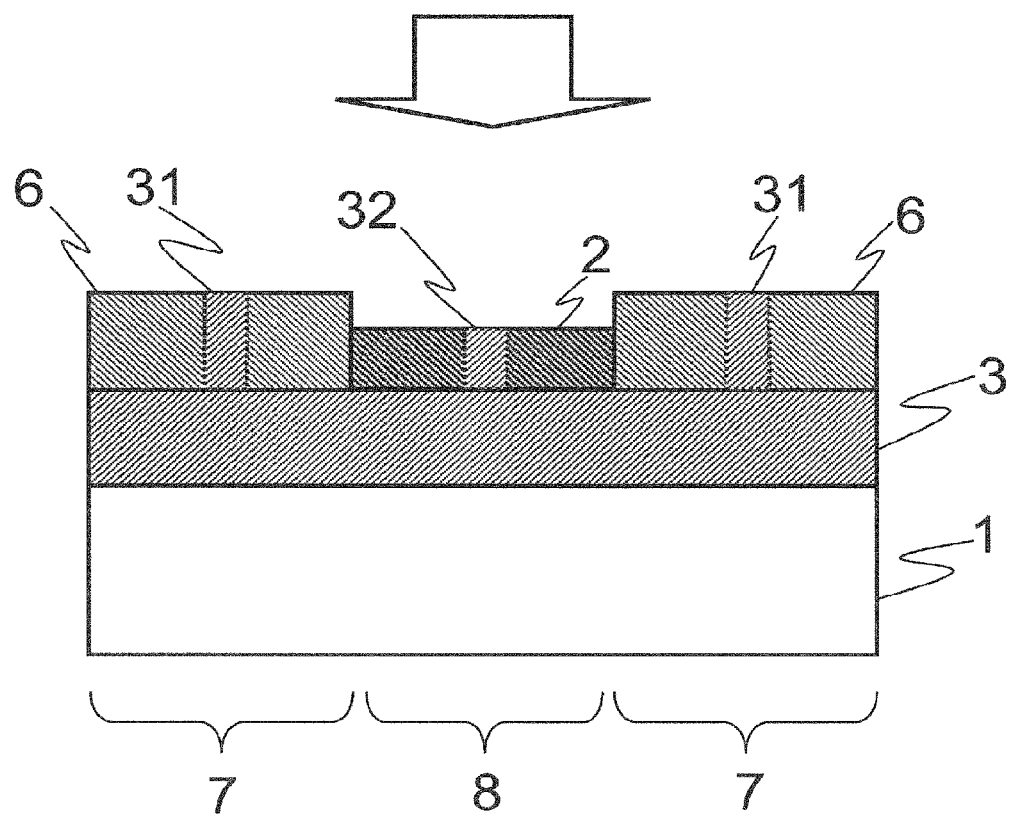
FIG. 15 is a cross-sectional view of the substrate schematically illustrating the exposure step, and the PEB step after the exposure step, of the writing step according to the third embodiment of the present invention.

FIG. 15 is a cross-sectional view of the substrate schematically illustrating the light exposure step, and the PEB step after the light exposure step, of the writing step according to the third embodiment of the present invention.

In FIG. 15, the substrate 1 in which the pattern is written is illustrated. The light shielding film 3 is formed on the surface of the substrate 1. Further, a first region 7 in which the second resist film 6 is formed, and a second region 8 in which the first resist film 2 is formed, are separately formed on the substrate, that is, on the light shielding film 3 of the substrate 1.

The light exposure step (S306) of the writing method of the third embodiment of the present invention performs light exposure on the substrate 1 in which a pattern is transferred by using an electron beam and writes a predetermined pattern in each of a second resist film 6 in a first region 7 and a first resist film 2 in a second region 8.

In this case, as described above, the first resist film 2 is a positive type chemically amplified resist film formed by using the spin coating method using a positive type chemical amplification resist. Also, as described above, the second resist film 6 is a positive type chemically amplified resist film formed by using the spin coating method using a positive type chemical amplification resist, but is formed by using a resist having sensitivity different from that of the positive chemical amplification resist used for formation of the first resist film 2, for example, a resist having higher sensitivity. Therefore, the second resist film 6 has a higher sensitivity compared to the first resist film 2. In other words, the first resist film 2 has a lower sensitivity compared to the second resist film 6.

Therefore, in the light exposure step (S306) of the writing method of the third embodiment of the present invention, a pattern requiring high accuracy is written on the first resist film 2 in the second region 8. As a result, the writing method of the third embodiment of the present invention can improve, for example, CD accuracy with respect to a pattern requiring high accuracy corresponding to a reduction in component dimension.

Also, in the light exposure step (S306) of the writing method of the third embodiment of the present invention, a pattern having a wide writing area and not requiring high accuracy, for example, an ID chip or the like, is written on the second resist film 6 in the first region 7. As a result, the writing method of the third embodiment of the present invention can perform writing with high efficiency with respect to the pattern not requiring high accuracy.

As described above, the writing method of the third embodiment of the present invention facilitates electron beam writing with high accuracy and high throughput corresponding to a pattern to be written.

In addition, the writing method of the third embodiment of the present invention can include the PEB step (S307) of performing a PEB step for promoting reaction within a resist in a heating step after light exposure, after the light exposure step (S306).

By the PEB step (S307), a reaction within the first resist film 2 and the second resist film 6 is promoted and therefore, latent images 31 and 32 corresponding to light-exposed patterns are formed in the first resist film 2 and the second resist film 6, respectively, on the substrate 1, as illustrated in FIG. 15.

Subsequently, the writing method of the third embodiment of the present invention performs development by immersing the substrate 1 which has passed through the PEB step (S307) in a development liquid in the development step (S308). Thereby, an unnecessary portion of the substrate 1 is removed, and a fine pattern by a resist is respectively formed in the first region 7 and the second region 8.

The writing method of the third embodiment of the present invention including the above steps sets a substrate having a plurality of regions, into which a plurality of types of resist films formed using the spin coating method are divided, as the substrate in which a pattern is transferred. That is, it is possible to arrange, for example, a low-sensitivity resist film in a region in which a pattern requiring high accuracy is formed and a high-sensitivity resist film in a region in which a pattern not requiring high accuracy is formed on one substrate by using the spin coating method, and perform writing. As a result, the writing method of the third embodiment of the present invention can enhance throughput of electron beam writing.

Although the writing method of the third embodiment of the present invention uses, as a substrate in which a pattern is transferred, the substrate obtained by the aforementioned method for forming a resist film of the first embodiment of the present invention, the substrate obtained by the aforementioned method for forming a resist film of the second embodiment of the present invention may be used as a substrate in which a pattern is transferred as another example. In this case, it is possible to arrange, for example, a low-sensitivity resist film in a region in which a pattern requiring high accuracy is formed and a high-sensitivity resist film in a region in which a pattern not requiring high accuracy is formed, on one substrate by using the spin coating method, and perform writing, similarly to the case of using, as a substrate in which a pattern is transferred, the substrate obtained by the aforementioned method for forming a resist film of the first embodiment of the present invention. Furthermore, it is possible to enhance throughput of electron beam writing.

The present invention could also be utilized by the following methods.

According to one aspect of the present invention, a method for forming a resist film includes forming a first resist film on a substrate, by using a spin coating method. A light shielding film is formed on the substrate. A protective film is formed on the first resist film. A region of the protective film and a region of the first resist film corresponding to the region of the protective film is removed to expose a portion of the light shielding film. A second resist film is formed on the protective film and an exposed portion of the light shielding film on the substrate using a spin coating method to provide a first region in which the second resist film is formed on the light shielding film and a second region in which the second resist film is formed on the first resist film through the protective film. The protective film in the second region is simultaneously removed with the second resist film to expose the first resist film and separately provide a region in which the first resist film is formed and a region in which the second resist film is formed on the substrate.

According to another aspect of the present invention, a method for forming a resist film includes a first resist film forming step of forming a first resist film on a substrate, by using a spin coating method. A light shielding film is formed on the substrate. In a first protective film forming step, a protective film is formed on the first resist film. In a first removing step, a region of the protective film and a region of the first resist film corresponding to the region of the protective film are removed to expose a portion of the light shielding film. In a second resist film forming step, a second resist film is formed on the protective film and an exposed portion of the light shielding film on the substrate using a spin coating method to provide a first region in which the second resist film is formed on the light shielding film, and a second region in which the second resist film is formed on the first resist film through the protective film. In a first protective film removing step, the protective film is simultaneously removed with the second resist film in the second region to separately provide a region in which the first resist film is formed and a region in which the second resist film is formed on the light shielding film. In a second protective film forming step, a protective film is formed on the substrate after the protective film removing step. In a second removing step, a portion of the protective film formed in the second protective film forming step, is removed with a portion of at least one of the first resist film and the second resist film formed under the protective film to provide a removing region in which the substrate is exposed. In a third resist film forming step, a third resist film is formed on the substrate after the second removing step using the spin coating method to provide a third region in which the third resist film is formed in the removing region, and a fourth region in which the third resist film is formed on the first resist film and the second resist film through the protective film. In a second protective film removing step, the protective film is simultaneously removed with the third resist film in the fourth region to separately form a region in which the first resist film is provided, a region in which the second resist film is provided, and a region in which the third resist film is provided, on the light shielding film.

According to another aspect of the present invention, a charged particle beam writing method includes forming a first resist film on a substrate, by using a spin coating method. A light shielding film is formed on the substrate. A protective film is formed on the first resist film. A region of the protective film and a region of the first resist film corresponding to the region of the protective film is removed to expose a portion of the light shielding film. A second resist film is formed on the protective film and an exposed portion of the light shielding film on the substrate using a spin coating method to provide a first region in which the second resist film is formed on the light shielding film, and a second region in which the second resist film is formed on the first resist film through the protective film. The protective film in the second region is simultaneously removed with the second resist film to expose the first resist film and separately provide a region in which the first resist film is provided and a region in which the second resist film is provided on the substrate. A pattern is written on each of the first resist film and the second resist film using a charged particle beam.

The present invention is not limited to the above-mentioned embodiments and can be implemented in various ways without departing from the spirit of the invention. For example, although light exposure is performed by irradiating an electron beam onto the resist film in the above embodiments, other charged particle beams, such as an ion beam, may be irradiated. A laser beam, such as a KrF (krypton fluoride) excimer laser (wavelength: 248 nm) or an ArF (argon fluoride) excimer laser (wavelength: 193 nm) may be irradiated, and the case of using liquid immersion exposure light by ArF or extreme ultra violet (EUV) as an exposure light source may be applicable.

Although the chemically amplified resist film is used as the resist film in the aforementioned embodiments, a non-chemically amplified resist film may be also used.

What is claimed is:

1. A method for forming a resist film, comprising the steps of:
    forming a first resist film on a light shielding film formed on a substrate, by using a spin coating method;
    forming a protective film on the first resist film;
    simultaneously removing a region of the protective film and a region of the first resist film corresponding to the region of the protective film, and exposing a portion of the light shielding film;
    forming a second resist film on the protective film and an exposed portion of the light shielding film on the substrate using a spin coating method, and providing a first region in which the second resist film is formed on the light shielding film and a second region in which the second resist film is formed on the protective film; and
    separately forming a region in which the first resist film is provided on the light shielding film and a region in which the second resist film is provided on the light shielding film, by simultaneously removing the protective film and the second resist film in the second region.

2. The method for forming a resist film according to claim 1, wherein the first resist film and the second resist film have different sensitivities to each other.

3. The method for forming a resist film according to claim 1, wherein both the first resist film and the second resist film are positive type chemically amplified resist films.

4. The method for forming a resist film according to claim 1, wherein either the first resist film or the second resist film is a positive type chemically amplified resist film, and the other film is a negative type chemically amplified resist film.

5. The method for forming a resist film according to claim 1, wherein a relationship $(A+B)>(C)$ is satisfied between a thickness (A) of the first resist film, a thickness (B) of the protective film, and a thickness (C) of the second resist film.

6. A method for forming a resist film, comprising the steps of:
    forming a first resist film on a light shielding film formed on a substrate, by using a spin coating method;
    forming a first protective film on the first resist film;
    simultaneously removing a region of the first protective film and a region of the first resist film corresponding to the region of the first protective film, and exposing a portion of the light shielding film;
    forming a second resist film on the first protective film and an exposed portion of the light shielding film on the substrate using a spin coating method to provide a first region in which the second resist film is formed on the light shielding film, and a second region in which the second resist film is formed on the protective film;
    separately forming a region in which the first resist film is formed, and a region in which the second resist film is formed on the light shielding film, by simultaneously removing the first protective film and the second resist film in the second region;
    forming a second protective film on the first resist film in the second region and on the second resist film in the first region after removing the first protective film;
    simultaneously removing a portion of the second protective film and a portion of at least one of the first resist film and the second resist film under the second protective film to provide a removing region in which the light shielding film is exposed;
    forming a third resist film on the second protective film and in the removing region using the spin coating method to provide a third region in which the third resist film is formed in the removing region, and a fourth region in which the third resist film is formed on the second protective film that is formed on the first resist film, and the second resist film; and
    separately forming a region in which the first resist film is provided, a region in which the second resist film is provided, and a region in which the third resist film is provided, on the light shielding film, by simultaneously removing the second protective film and the third resist film in the fourth region.

7. The method for forming a resist film according to claim 6, wherein the first resist film, the second resist film, and the third resist film have different sensitivities respectively.

8. The method for forming a resist film according to claim 6, wherein both the first resist film, the second resist film, and the third resist film are positive type chemically amplified resist films.

9. The method for forming a resist film according to claim 6, wherein one or two of the first resist film, the second resist film, and the third resist film is a positive type chemically amplified resist film, and the remaining film is a negative type chemically amplified resist film.

10. A charged particle beam writing method, comprising:
    forming a first resist film on a light shielding film formed on a substrate, by using a spin coating method;
    forming a protective film on the first resist film;
    simultaneously removing a region of the protective film and a region of the first resist film corresponding to the region of the protective film, and exposing a portion of the light shielding film;
    forming a second resist film on the protective film and an exposed portion of the light shielding film on the substrate using a spin coating method, and providing a first region in which the second resist film is formed on the light shielding film and a second region in which the second resist film is formed on the protective film;
    separately forming a region in which the first resist film is provided on the light-shielding film and a region in which the second resist film is provided, by simultaneously removing the protective film and the second resist in the second region; and
    writing a pattern on each of the first resist film and the second resist film using a charged particle beam.

11. The charged particle beam writing method according to claim 10, wherein the first resist film and the second resist film have different sensitivities to each other.

12. The charged particle beam writing method according to claim 10, wherein either the first resist film or the second resist film is a positive type chemically amplified resist film, and the other film is a negative type chemically amplified resist film.

13. The charged particle beam writing method according to claim 10, a relationship (A+B)>(C) is satisfied between a thickness (A) of the first resist film, a thickness (B) of the protective film, and a thickness (C) of the second resist film.

* * * * *